United States Patent
Takashima

(10) Patent No.: US 9,653,681 B2
(45) Date of Patent: May 16, 2017

(54) SEMICONDUCTOR MEMORY DEVICE

(71) Applicant: Kabushiki Kaisha Toshiba, Minato-ku (JP)

(72) Inventor: Daisaburo Takashima, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/838,535

(22) Filed: Aug. 28, 2015

(65) Prior Publication Data

US 2016/0268342 A1     Sep. 15, 2016

Related U.S. Application Data

(60) Provisional application No. 62/132,156, filed on Mar. 12, 2015.

(51) Int. Cl.
*H01L 45/00* (2006.01)
*H01L 27/24* (2006.01)

(52) U.S. Cl.
CPC ........ *H01L 45/1233* (2013.01); *H01L 27/249* (2013.01); *H01L 27/2472* (2013.01); *H01L 45/04* (2013.01); *H01L 45/122* (2013.01); *H01L 45/1253* (2013.01)

(58) Field of Classification Search
CPC ......... H01L 45/04; H01L 45/06; H01L 45/10; H01L 45/12; H01L 45/122; H01L 45/1206; H01L 45/1233; H01L 45/1253; H01L 45/14; H01L 45/141; H01L 45/144; H01L 45/145; H01L 27/24; H01L 27/2427; H01L 27/2463; H01L 27/2472; H01L 27/249
See application file for complete search history.

(56) References Cited

U.S. PATENT DOCUMENTS

| 7,920,408 B2 | 4/2011 | Azuma et al. |
| 2012/0147649 A1* | 6/2012 | Samachisa ......... G11C 13/0002 365/51 |
| 2013/0242638 A1 | 9/2013 | Takashima |
| 2014/0340956 A1 | 11/2014 | Murooka |

FOREIGN PATENT DOCUMENTS

| JP | 5222761 | 6/2013 |
| JP | 2013-140667 | 7/2013 |
| JP | 2013-196720 | 9/2013 |
| JP | 2014-225314 | 12/2014 |

OTHER PUBLICATIONS

U.S. Appl. No. 14/824,204, filed Aug. 12, 2015, Daisaburo Takashima.
Yexin Deng et al. "Design and Optimization Methodology for 3D RRAM Arrays", Electron Devices Meeting (IEDM), 2013 IEEE International, Dec. 9-11, 2013, 4 pages.

* cited by examiner

*Primary Examiner* — Eduardo A Rodela
(74) *Attorney, Agent, or Firm* — Oblon, McClelland, Maier & Neustadt, L.L.P.

(57) ABSTRACT

According to one embodiment, a semiconductor memory device includes a plurality of first resistance-change memory elements of a two-terminal type, a second resistance-change memory element of a two-terminal type, a rectifier element of a two-terminal type, a local bit line connected to ends of the first resistance-change memory elements, an end of the second resistance-change memory element and an end of the rectifier element, and a global bit line connected to the other end of the second resistance-change memory element.

13 Claims, 22 Drawing Sheets

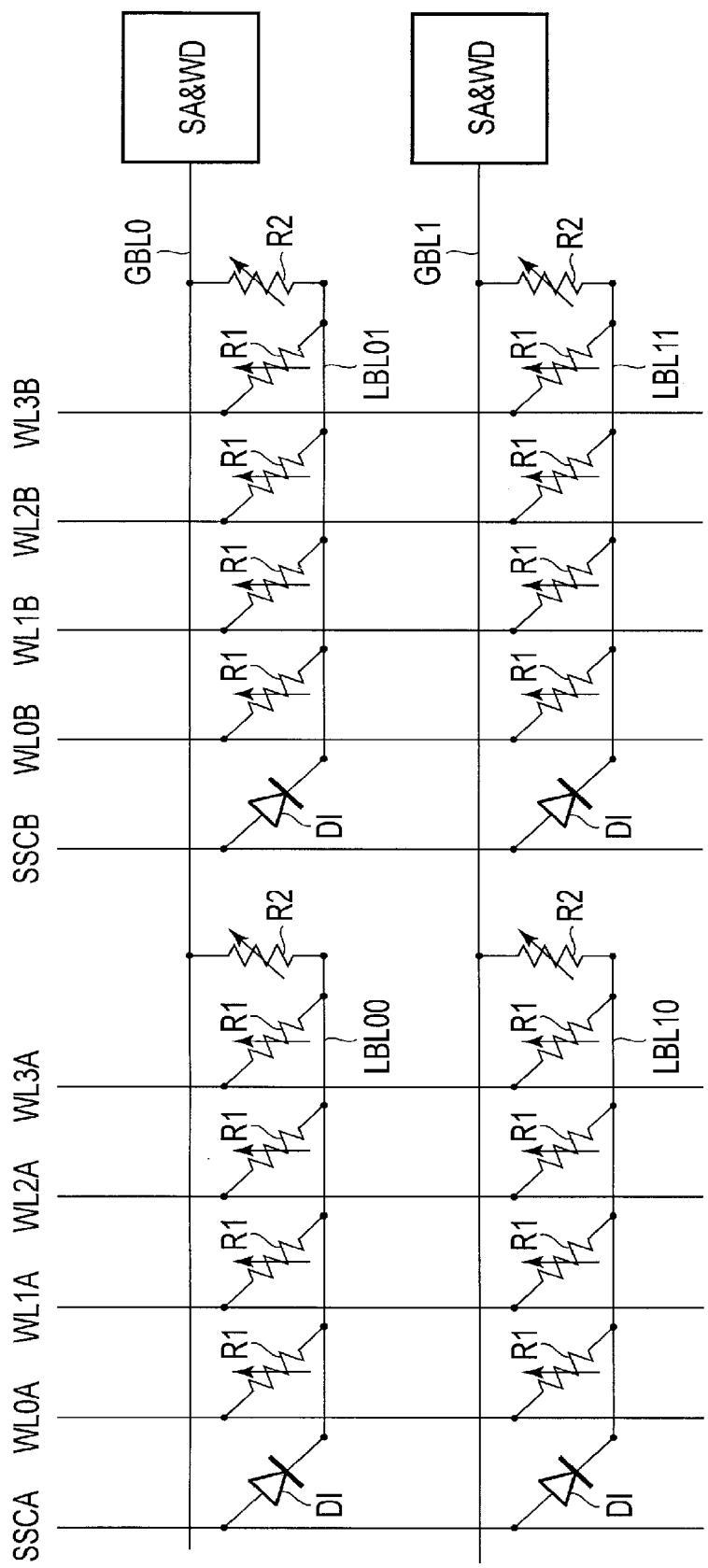
F I G. 1

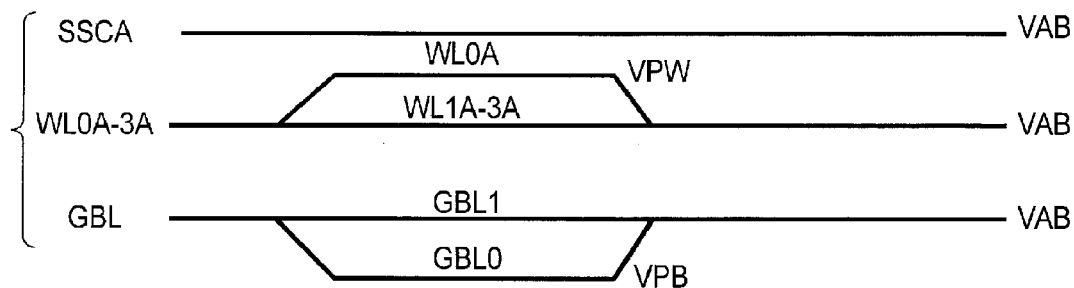
F I G. 3A
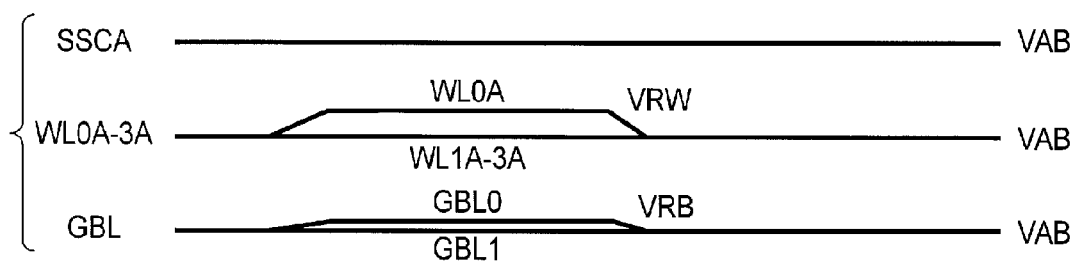
F I G. 3B
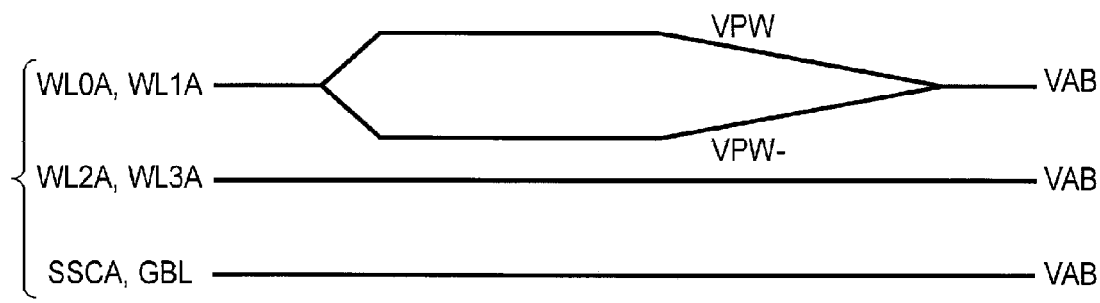
F I G. 4

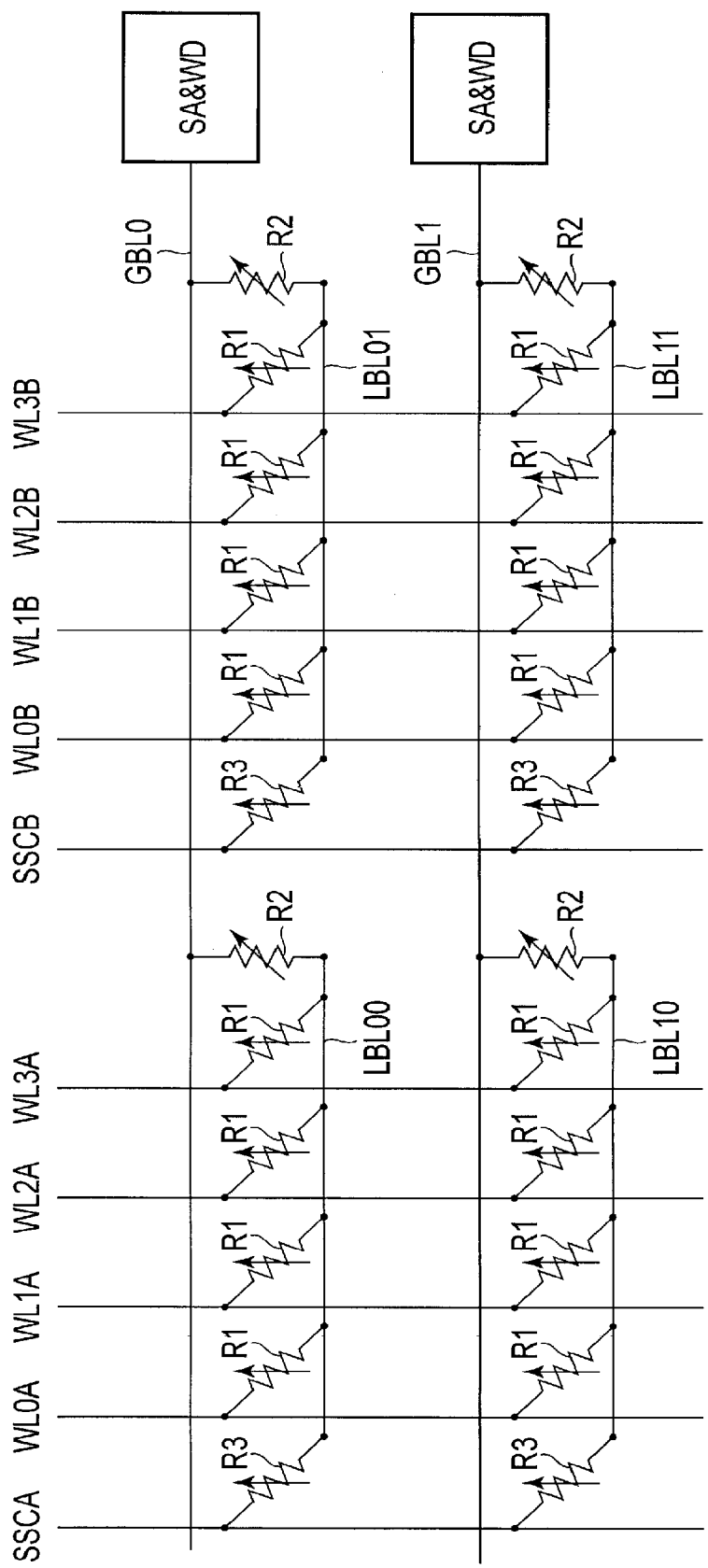
F I G. 5

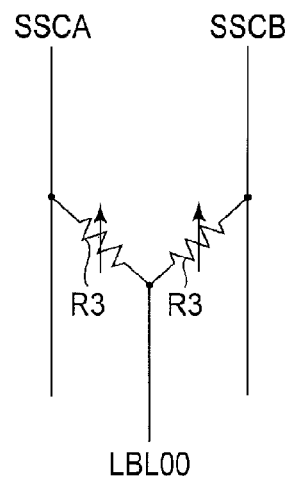
F I G. 6A
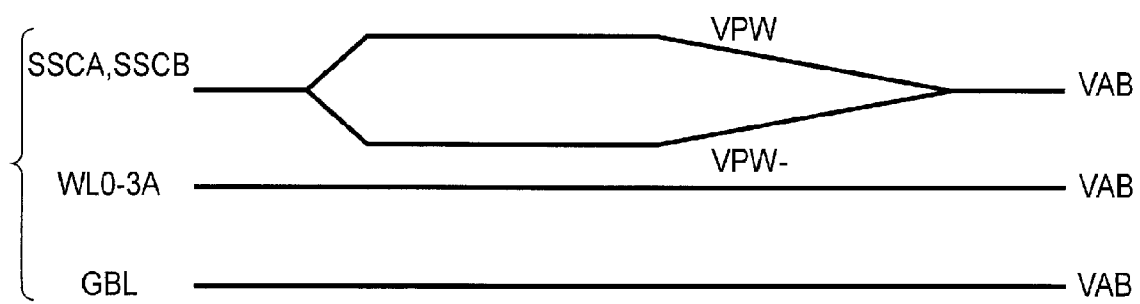
F I G. 6B

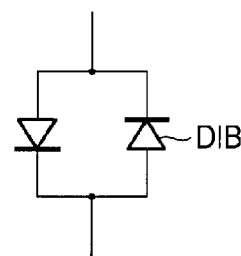
F I G. 7A
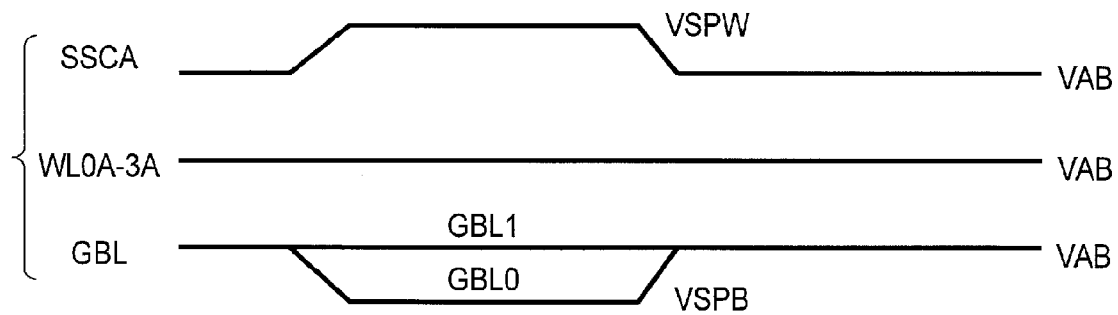
F I G. 7B
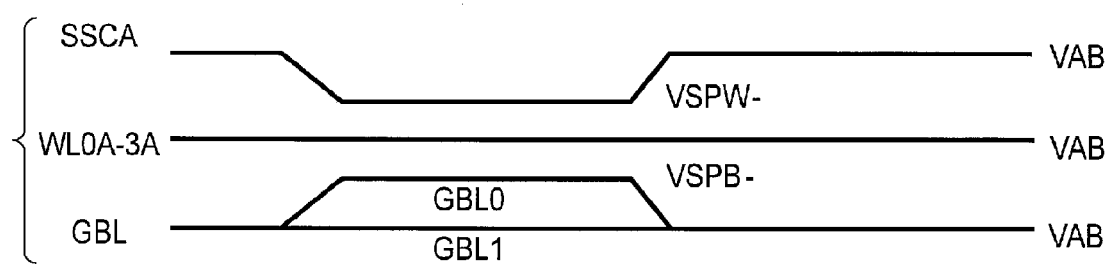
F I G. 7C

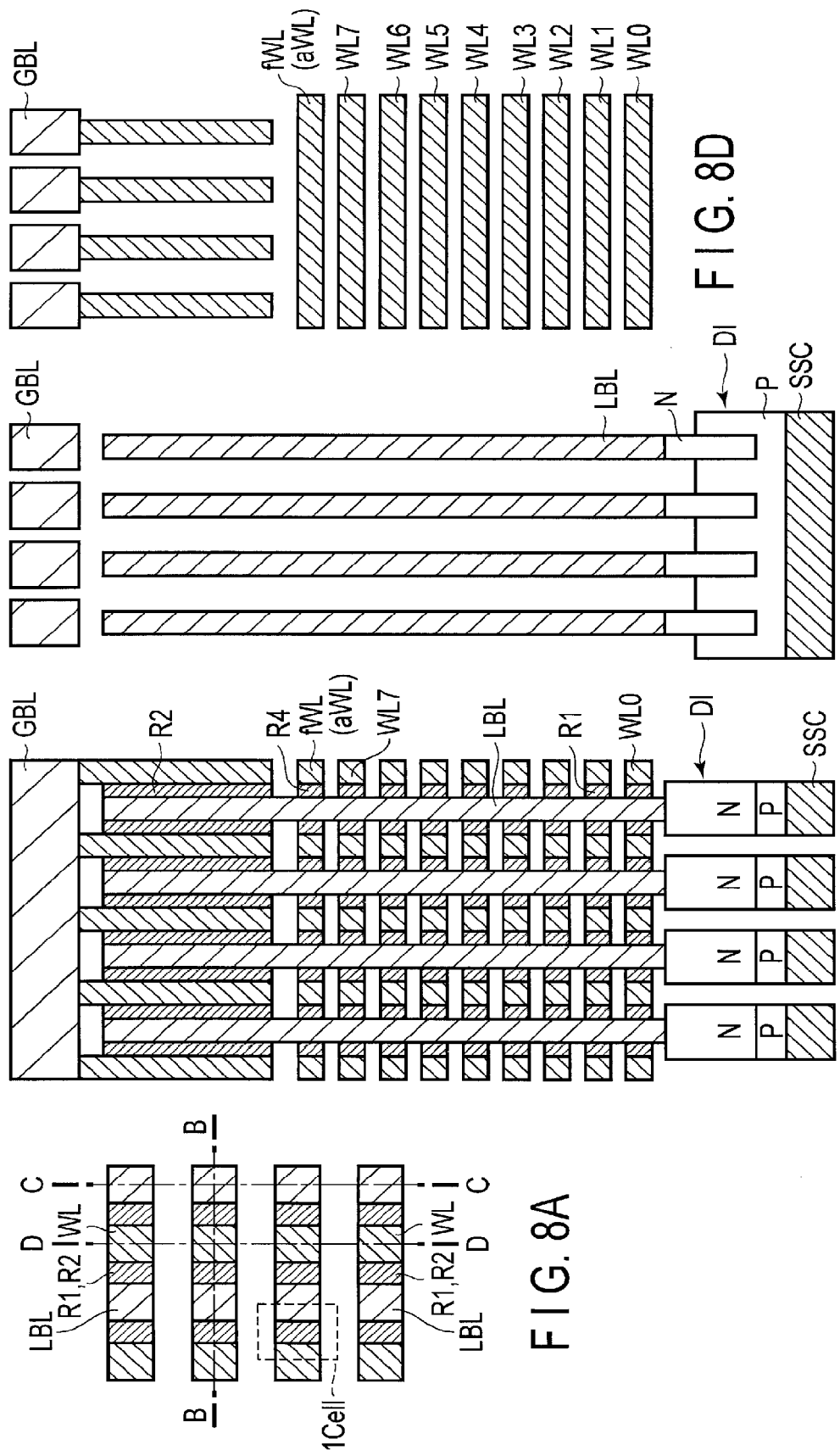

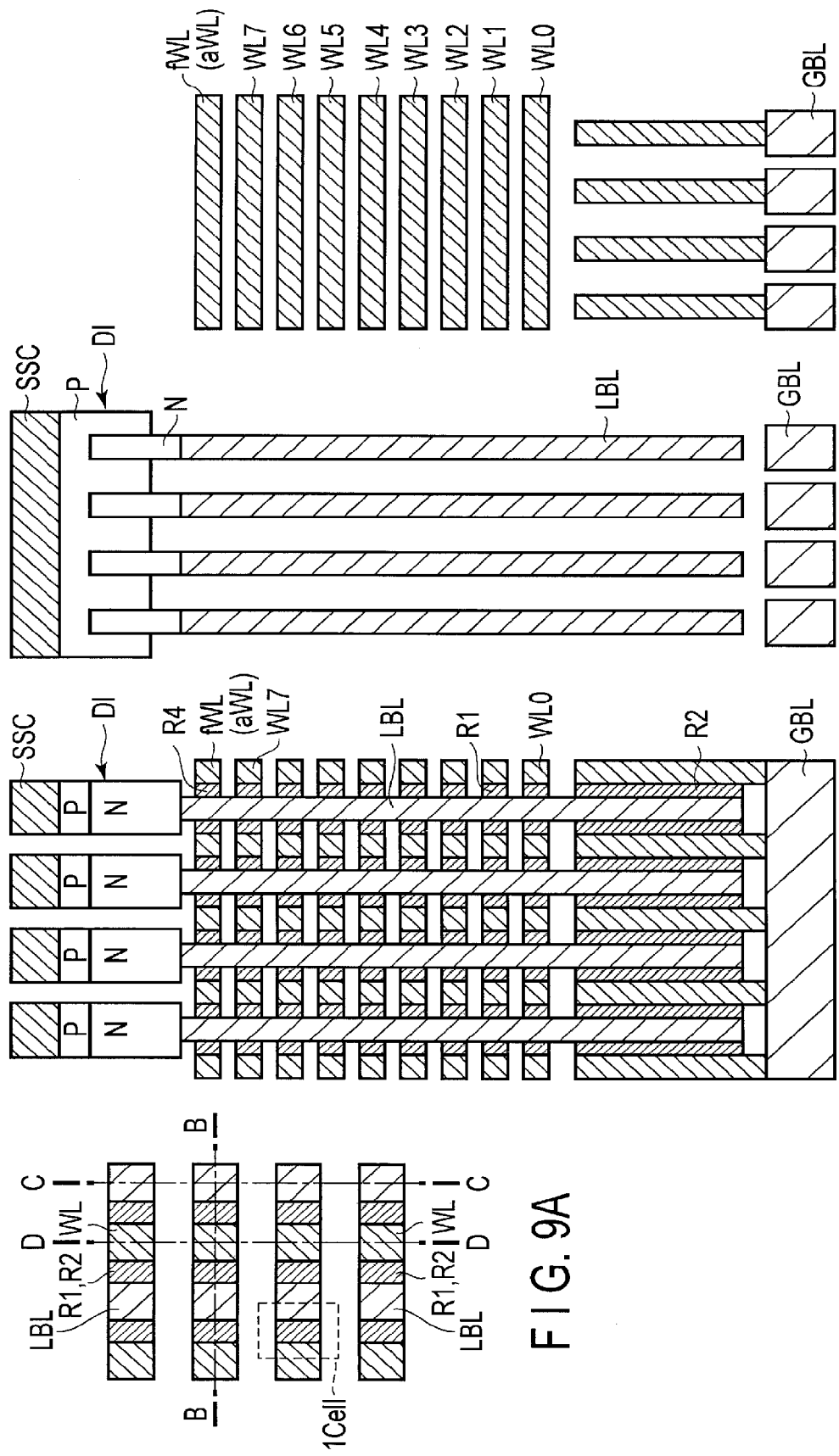

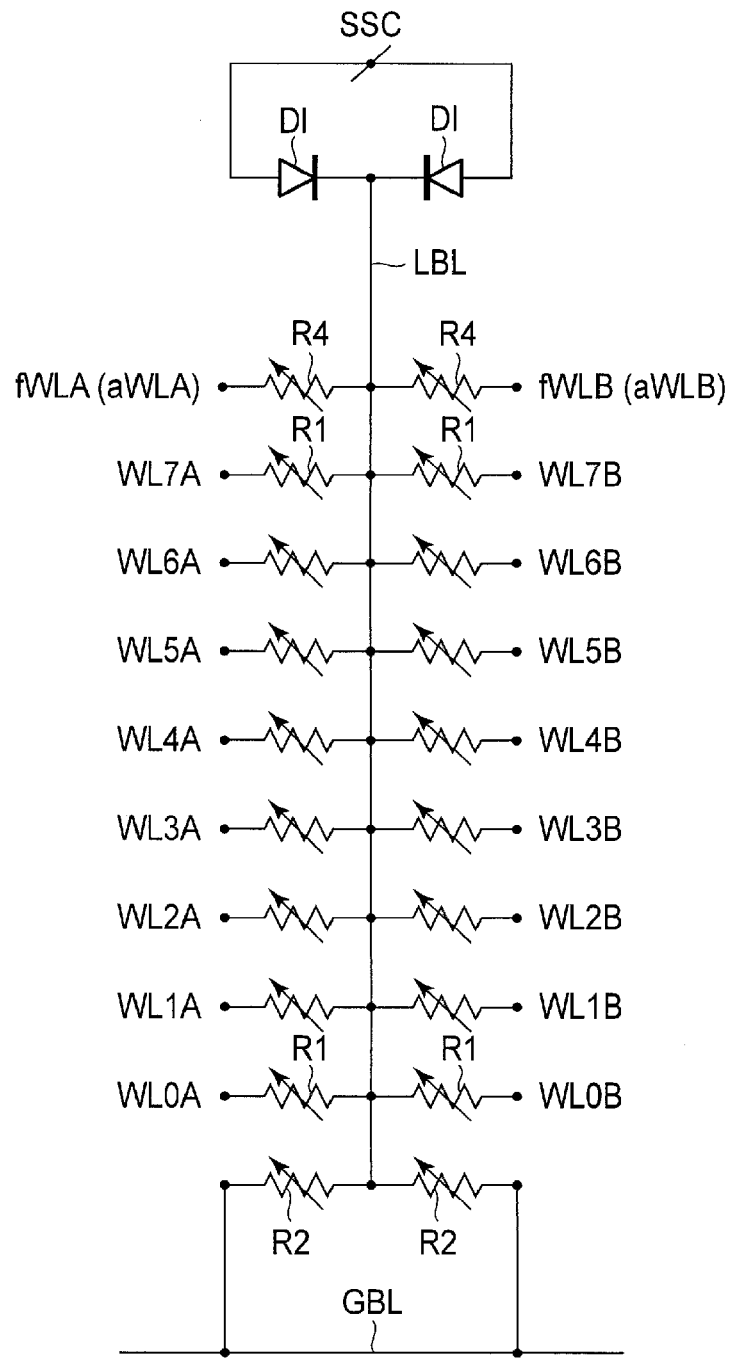
F I G. 11

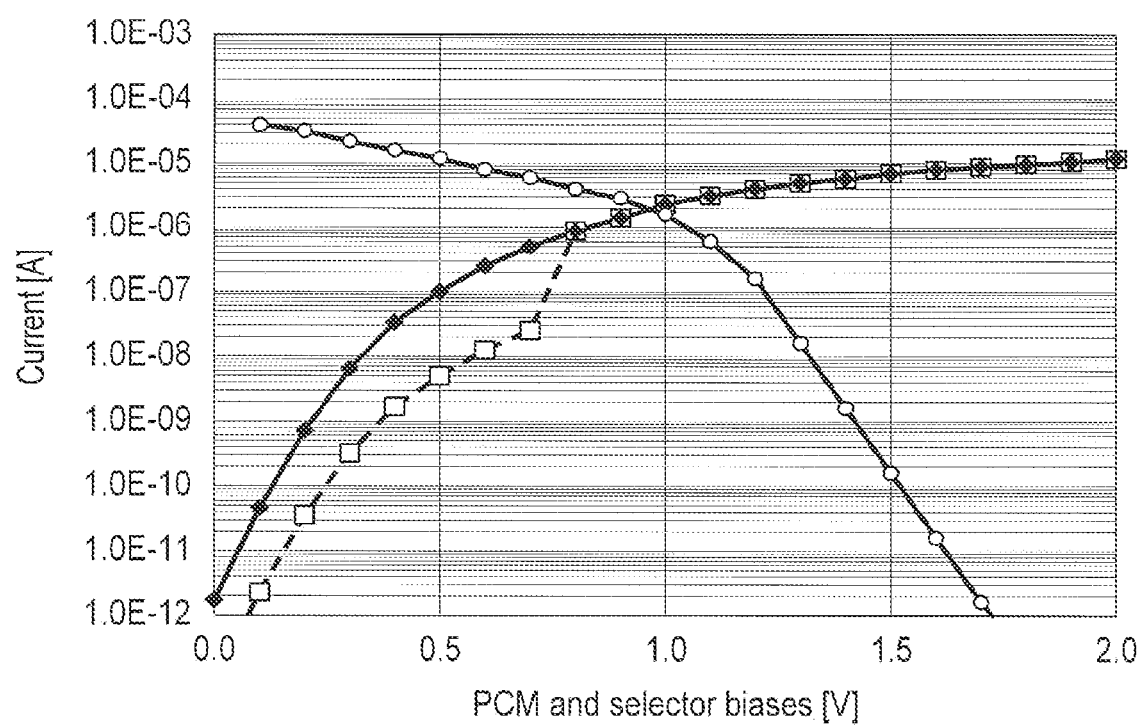
F I G. 13

FIG. 15A  
0=LRS, 1=HRS

| Cell0 | Cell1 | Cell1 | Cell3 | Sum of sets |
|---|---|---|---|---|
| 0 | 0 | 0 | 0 | 4 |
| 0 | 0 | 0 | 1 | 3 |
| 0 | 0 | 1 | 0 | 3 |
| 0 | 0 | 1 | 1 | 2 |
| 0 | 1 | 0 | 0 | 3 |
| 0 | 1 | 0 | 1 | 2 |
| 0 | 1 | 1 | 0 | 2 |
| 0 | 1 | 1 | 1 | 1 |
| 1 | 0 | 0 | 0 | 3 |
| 1 | 0 | 0 | 1 | 2 |
| 1 | 0 | 1 | 0 | 2 |
| 1 | 0 | 1 | 1 | 1 |
| 1 | 1 | 0 | 0 | 2 |
| 1 | 1 | 0 | 1 | 1 |
| 1 | 1 | 1 | 0 | 1 |
| 1 | 1 | 1 | 1 | 0 |

FIG. 15B  
0=LRS, 1=HRS

| | | | | fCell | Sum of sets |
|---|---|---|---|---|---|
| 0 | 0 | 0 | 0 | 1 | 4 |
| 0 | 0 | 0 | 1 | 1 | 3 |
| 0 | 0 | 1 | 0 | 1 | 3 |
| 1 | 0 | 0 | 0 | 0 | 3 |
| 0 | 1 | 0 | 0 | 1 | 3 |
| 0 | 1 | 0 | 0 | 0 | 4 |
| 1 | 1 | 0 | 1 | 0 | 3 |
| 1 | 0 | 0 | 0 | 0 | 4 |
| 1 | 0 | 0 | 1 | 1 | 3 |
| 0 | 1 | 1 | 0 | 0 | 3 |
| 0 | 1 | 0 | 1 | 0 | 3 |
| 0 | 1 | 1 | 0 | 0 | 4 |
| 0 | 0 | 1 | 1 | 0 | 3 |
| 0 | 0 | 0 | 1 | 0 | 4 |
| 0 | 0 | 1 | 0 | 0 | 4 |
| 0 | 0 | 0 | 0 | 0 | 5 |

FIG. 15C  
0=LRS, 1=HRS

| Cell0 | Cell1 | Cell1 | Cell3 | aCell | Sum of sets |
|---|---|---|---|---|---|
| 0 | 0 | 0 | 0 | 0 | 5 |
| 0 | 0 | 0 | 1 | 0 | 4 |
| 0 | 0 | 1 | 0 | 0 | 4 |
| 0 | 0 | 1 | 1 | 0 | 3 |
| 0 | 1 | 0 | 0 | 0 | 4 |
| 0 | 1 | 0 | 1 | 0 | 3 |
| 0 | 1 | 1 | 0 | 0 | 3 |
| 0 | 1 | 1 | 1 | 0 | 2 |
| 1 | 0 | 0 | 0 | 0 | 4 |
| 1 | 0 | 0 | 1 | 0 | 3 |
| 1 | 0 | 1 | 0 | 0 | 3 |
| 1 | 0 | 1 | 1 | 0 | 2 |
| 1 | 1 | 0 | 0 | 0 | 3 |
| 1 | 1 | 0 | 1 | 0 | 2 |
| 1 | 1 | 1 | 0 | 0 | 2 |
| 1 | 1 | 1 | 1 | 0 | 1 |

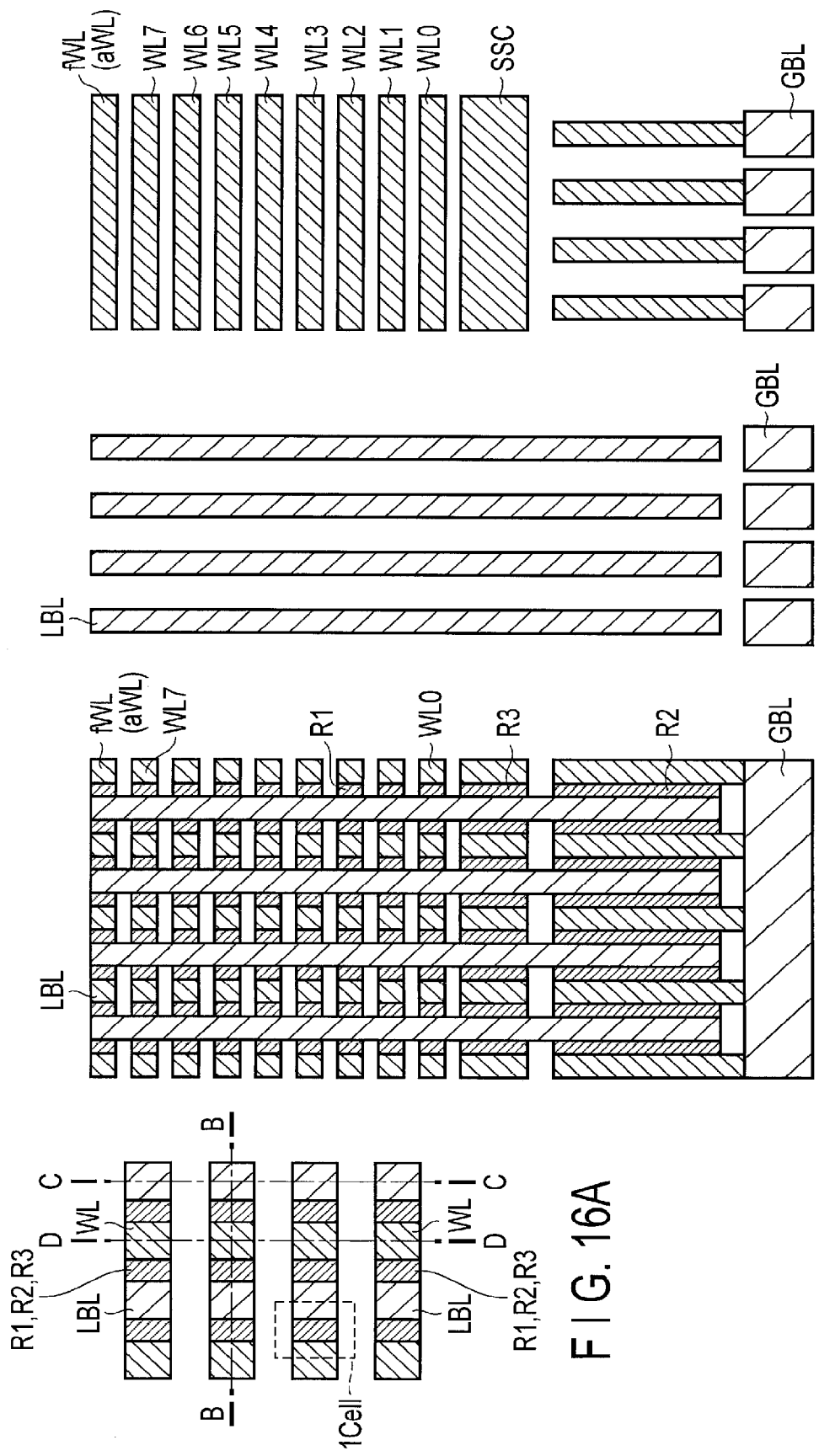

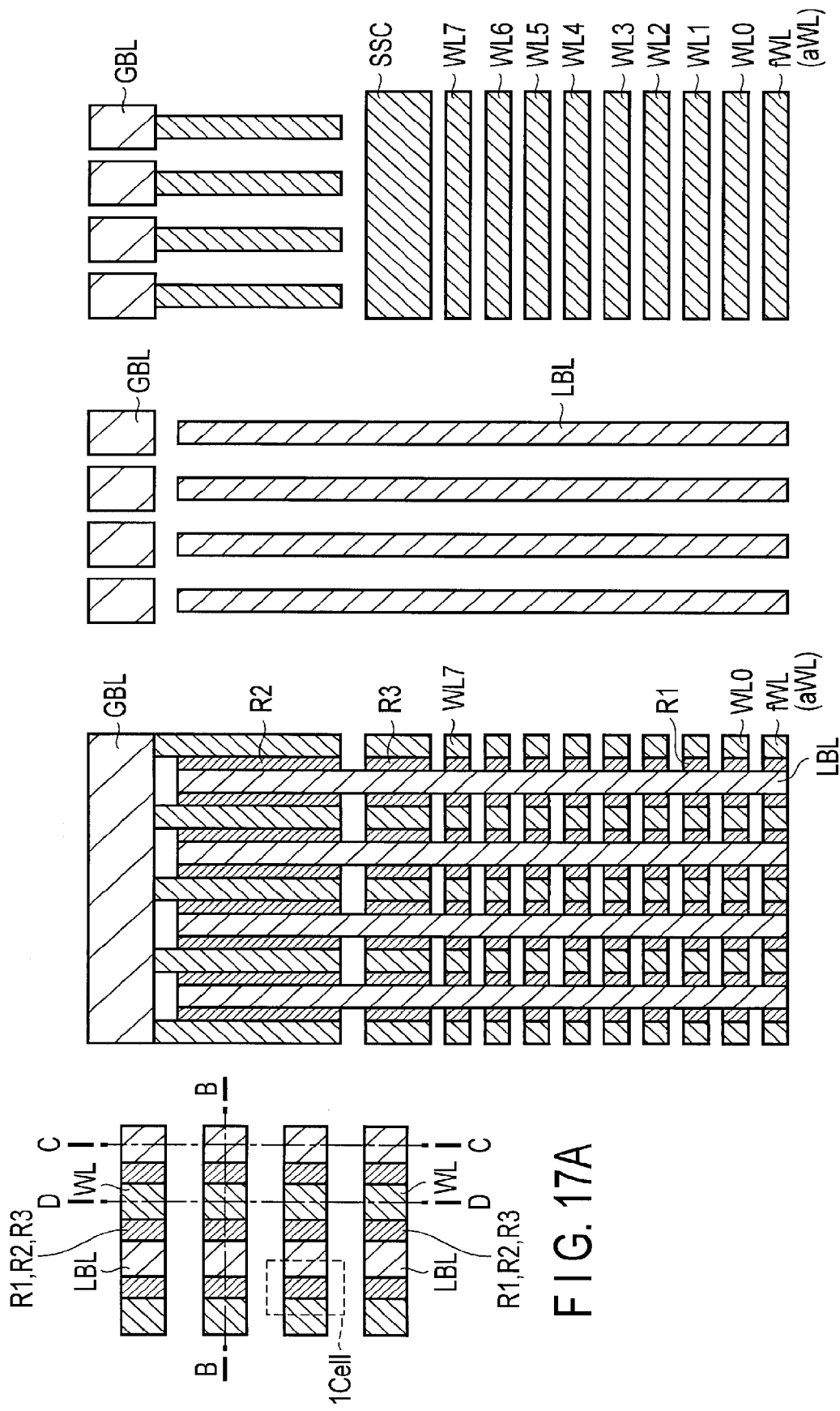

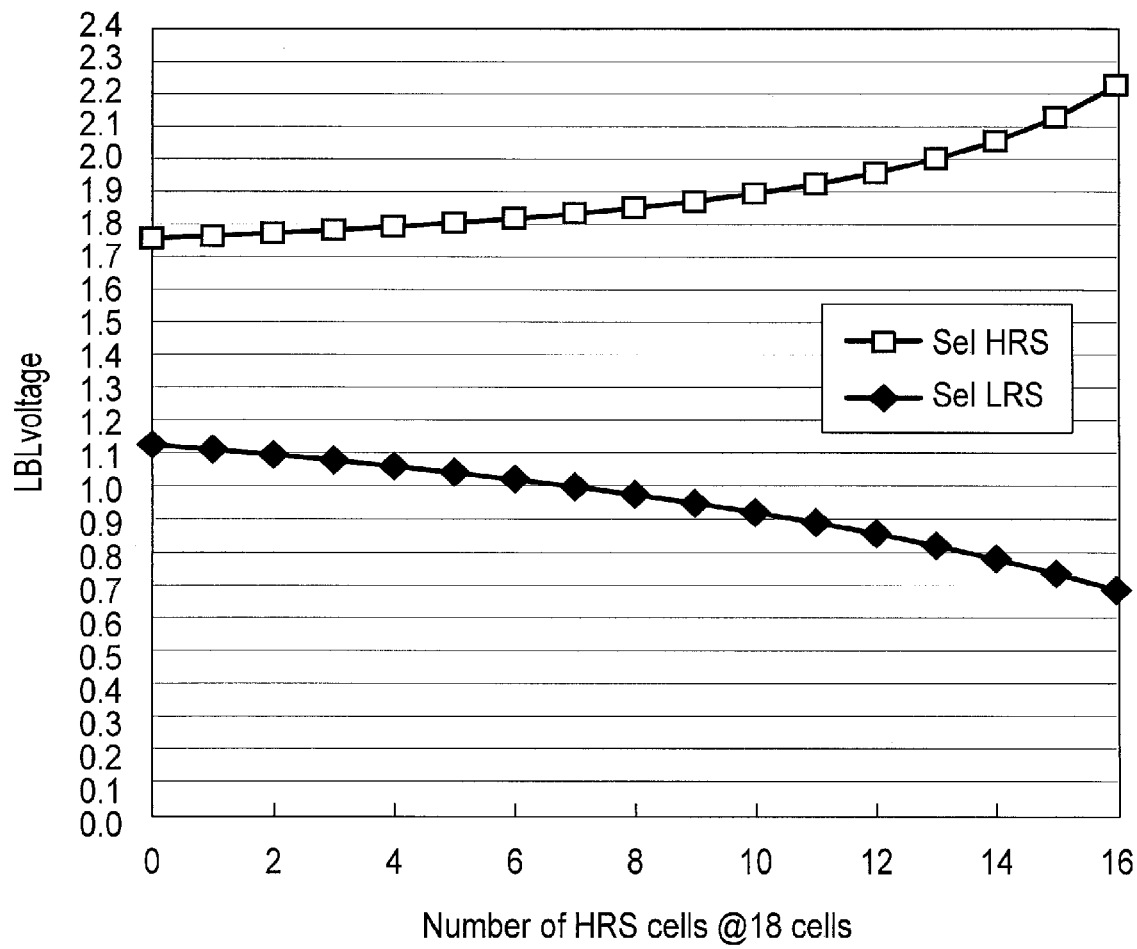
F I G. 20

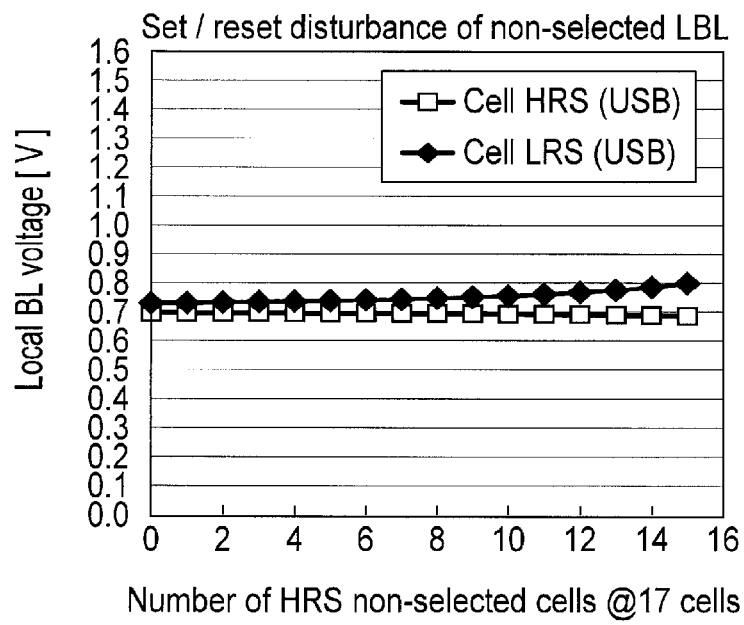
F I G. 21C
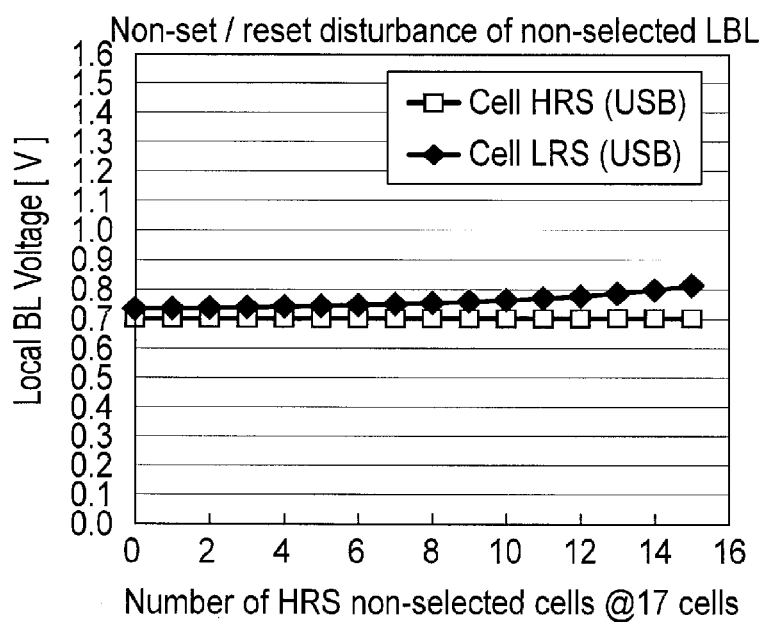
F I G. 21D

SEMICONDUCTOR MEMORY DEVICE

CROSS-REFERENCE TO RELATED APPLICATIONS

This application claims the benefit of U.S. Provisional Application No. 62/132,156, filed Mar. 12, 2015, the entire contents of which are incorporated herein by reference.

FIELD

Embodiments described herein relate generally to a semiconductor memory device.

BACKGROUND

As nonvolatile semiconductor memory devices, for example, phase-change memories (PRAM, PCM) and resistance-change memories (PRAM, ReRAM) are suggested. All of these memories are semiconductor memory devices using a resistance-change memory element.

However, since a resistance-change memory element is a two-terminal element, there is a need to provide a select element such as a transistor for each resistance-change memory element. Thus, the cell size or the number of manufacturing processes is increased. A large increase in the cell size or the number of manufacturing processes is a significant problem particularly for a three-dimensional structure in which a plurality of resistance-change memory elements are stacked.

To solve this problem, a semiconductor memory device which can prevent a large increase in the cell size or the number of manufacturing processes is required.

BRIEF DESCRIPTION OF THE DRAWINGS

FIG. 1 is an electronic schematic showing a structure of a semiconductor memory device according to a first embodiment.

FIG. 3A is a timing chart showing an operation which is performed when data is written to a first resistance-change memory element according to the first embodiment.

FIG. 3B is a timing chart showing an operation which is performed when data is read from the first resistance-change memory element according to the first embodiment.

FIG. 4 is a timing chart showing a method of suppressing disturbance of a non-selected cell according to the first embodiment.

FIG. 5 is an electronic schematic showing a structure of a semiconductor memory device according to a second embodiment.

FIG. 6A shows a structure of a modification example of the second embodiment.

FIG. 6B is a timing chart showing an operation of the modification example of the second embodiment.

FIG. 7A shows a structure when a bipolar element is used according to the second embodiment.

FIG. 7B is a timing chart showing an operation which is performed when a bipolar element is used according to the second embodiment.

FIG. 7C is a timing chart showing an operation which is performed when a bipolar element is used according to the second embodiment.

FIG. 8A is a plan view showing a structure of a semiconductor memory device according to a third embodiment.

FIG. 8B is a cross-sectional view taken along line B-B of FIG. 8A.

FIG. 8C is a cross-sectional view taken along line C-C of FIG. 8A.

FIG. 8D is a cross-sectional view taken along line D-D of FIG. 8A.

FIG. 9A is a plan view showing a structure of the semiconductor memory device according to a first modification example of the third embodiment.

FIG. 9B is a cross-sectional view taken along line B-B of FIG. 9A.

FIG. 9C is a cross-sectional view taken along line C-C of FIG. 9A.

FIG. 9D is a cross-sectional view taken along line D-D of FIG. 9A.

FIG. 11 shows an equivalent circuit of a sub-memory cell block in the semiconductor memory device according to the third embodiment.

FIG. 13 shows the analysis result of the potential of a local bit line when voltage is applied between a diode and a second resistance-change memory element according to the third embodiment.

FIG. 15A shows an effect which is obtained when a cell for a flag is introduced according to the third embodiment.

FIG. 15B shows an effect which is obtained when a cell for a flag is introduced according to the third embodiment.

FIG. 15C shows an effect which is obtained when a cell for a flag is introduced according to the third embodiment.

FIG. 16A is a plan view showing a structure of a semiconductor memory device according to a fourth embodiment.

FIG. 16B is a cross-sectional view taken along line B-B of FIG. 16A.

FIG. 16C is a cross-sectional view taken along line C-C of FIG. 16A.

FIG. 16D is a cross-sectional view taken along line D-D of FIG. 16A.

FIG. 17A is a plan view showing a structure of the semiconductor memory device according to a modification example of the fourth embodiment.

FIG. 17B is a cross-sectional view taken along line B-B of FIG. 17A.

FIG. 17C is a cross-sectional view taken along line C-C of FIG. 17A.

FIG. 17D is a cross-sectional view taken along line D-D of FIG. 17A.

FIG. 20 shows the voltage of a local bit line according to the fourth embodiment.

FIG. 21C shows the relationship between the number of HRS non-selected cells and the local bit line voltage according to the fourth embodiment.

FIG. 21D shows the relationship between the number of HRS non-selected cells and the local bit line voltage according to the fourth embodiment.

DETAILED DESCRIPTION

In general, according to one embodiment, a semiconductor memory device includes: a plurality of first resistance-change memory elements of a two-terminal type; a second resistance-change memory element of a two-terminal type; a rectifier element of a two-terminal type; a local bit line connected to ends of the first resistance-change memory elements, an end of the second resistance-change memory element and an end of the rectifier element; and a global bit line connected to the other end of the second resistance-change memory element.

Embodiments will be described hereinafter with reference to the accompanying drawings.

Embodiment 1

FIG. 1 is an electronic schematic showing a structure of a semiconductor memory device (semiconductor integrated circuit device) according to a first embodiment.

The semiconductor memory device shown in FIG. 1 comprises a plurality of sub-memory cell blocks (four sub-memory cell blocks are drawn in the example of FIG. 1) and a sense-amplifier and writing-driver (SA&WD) circuit.

Each sub-memory cell block comprises a plurality of first resistance-change memory elements R1 of a two-terminal type, a second resistance-change memory element R2 of a two-terminal type and a rectifier element (diode) DI of a two-terminal type.

A local bit line (LBL00, LBL01, LBL10, LBL11) is connected to ends of the first resistance-change memory elements R1, an end of the second resistance-change memory element R2 and an end of the rectifier element (diode) DI.

Word lines (WL0A to WL3A, WL0B to WL3B) are connected to the other ends of the first resistance-change memory elements R1. A global bit line (GBL0, GBL1) is connected to the other end of the second resistance-change memory element R2. A select switch control signal line (SSCA, SSCB) is connected to the other end of the diode DI.

The first resistance-change memory elements R1 are used as memory cells and can be set to two resistance states: a high-resistance state and a low-resistance state. By using the two resistance states, data (0 or 1) can be stored in the first resistance-change memory elements R1.

The second resistance-change memory element R2 can be also set to two resistance states: a high-resistance state and a low-resistance state. The second resistance-change memory element R2 is used as a select element (select switch). The second resistance-change memory element R2 functions in a switch-off state when the element is set to a high-resistance state. The second resistance-change memory element R2 functions in a switch-on state when the element is set to a low-resistance state.

Next, this specification explains the operation of the semiconductor memory device according to the present embodiment.

Figure 2A:
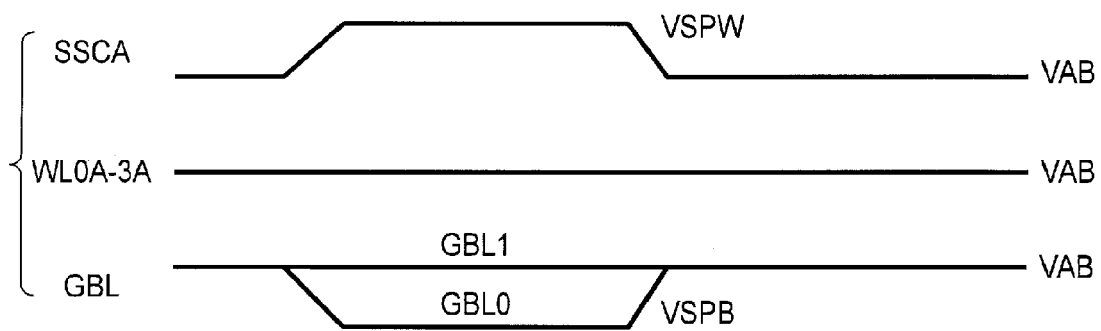
FIG. 2A is a timing chart showing an operation for setting a second resistance-change memory element to a high-resistance state according to the first embodiment.
Figure 2B:
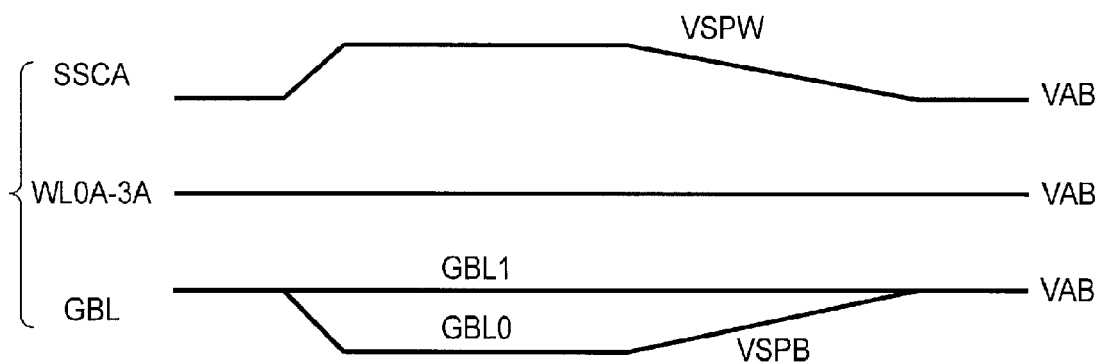
FIG. 2B is a timing chart showing an operation for setting the second resistance-change memory element to a low-resistance state according to the first embodiment.

FIG. 2A and FIG. 2B are timing charts showing operations for setting the second resistance-change memory element R2 which functions as a select switch to a high-resistance state and a low-resistance state.

When voltage VSPW is applied to select switch control signal line SSCA connected to the diode DI of the sub-memory cell block to be selected, and voltage VSPB is applied to global bit line GBL0 connected to the second resistance-change memory element R2 of the sub-memory cell block to be selected, the diode DI is in an on-state. As a result, divided voltage is applied to the selected second resistance-change memory element R2, thereby supplying current to the selected second resistance-change memory element R2.

Here, a phase-change memory element using a chalcogenide material including GeSbTe, or a phase-change memory element using a superlattice material including GeTe and SbTe is employed as the second resistance-change memory element R2. In this case, as shown in FIG. 2A, when a high-resistance-state setting signal in which the voltage pulse falls rapidly is supplied, the second resistance-change memory element R2 is set to a high-resistance state. As shown in FIG. 2B, when a low-resistance-state setting signal in which the voltage pulse falls gradually is supplied, the second resistance-change memory element R2 is set to a low-resistance state.

As is clear from the above description, the selected second resistance-change memory element R2 is set to a high-resistance state when a high-resistance-state setting signal is supplied between the anode terminal of the diode DI and global bit line GBL0 (FIG. 2A). The selected second resistance-change memory element R2 is set to a low-resistance state when a low-resistance-state setting signal is supplied between the anode terminal of the diode DI and global bit line GBL0 (FIG. 2B). In this manner, the second resistance-change memory element R2 of the selected sub-memory cell block can be set to an on-state (low-resistance state). The second resistance-change memory element R2 of a non-selected sub-memory cell block can be set to an off-state (high-resistance state). In the second resistance-change memory element R2, the ratio of resistance in a high-resistance state relative to resistance in a low-resistance state is approximately 100 to 1000. Thus, the second resistance-change memory element R2 can sufficiently serve as a switch.

Appropriate voltage VAB between voltage VSPW and voltage VSPB is applied to the word lines (WL0A to WL3A). With this application, no erroneous writing occurs in the first resistance-change memory elements R1 used as memory elements.

As is clear from the above explanation, the present embodiment allows the state of the select switch (second resistance-change memory element R2) to be set for each column (to an on-state or an off-state). In the examples shown in FIG. 2A and FIG. 2B, only the state of the select switch (second resistance-change memory element R2) of the selected column can be set to a desired state by applying low voltage VSPB to only the selected global bit line GBL0.

Next, this specification explains a write operation and a read operation relative to the first resistance-change memory elements R1. It is possible to write and read data relative to the desired first resistance-change memory element R1 connected to the second resistance-change memory element R2 which is set to a low-resistance state (on-state). These operations are described in detail below.

FIG. 3A is a timing chart showing an operation which is performed when data is written to the first resistance-change memory elements R1.

First, the select switch (second resistance-change memory element R2) of the sub-memory cell block to be selected is set to an on-state (low-resistance state) by the aforementioned method. In this state, low voltage VAB is applied to select switch control signal line SSCA in order to set the diode DI to a reverse-bias state. Further, voltage BPW is applied to the selected word line WL0A. Voltage VAB is applied to the other word lines WL1A to WL3A. Voltage VPB is applied to the selected global bit line GBL0. Voltage VAB is applied to global bit line GBL1.

By the above setting, high voltage (VPW-VPB) is applied to only the selected first resistance-change memory element R1. Thus, data can be written to only the selected first resistance-change memory element R1. At this time, intermediate voltage of VPW-VPB is applied to the non-selected first resistance-change memory elements R1. Therefore, no data is written to the non-selected first resistance memory elements R1.

In the above-described write operation, the VPW-VPB voltage is partially applied to the select switch (second resistance-change memory element R2); however, this problem can be solved by setting the size of the second resistance-change memory element R2 so as to be larger than that of each of the first resistance-change memory elements R1.

FIG. 3B is a timing chart showing an operation which is performed when data is read from the first resistance-change memory elements R1.

First, the select switch (second resistance-change memory element R2) of the sub-memory cell block to be selected is set to an on-state (low-resistance state). In this state, low voltage VAB is applied to select switch control signal line SSCA. Voltage VRW is applied to the selected word line WL0A. Voltage VAB is applied to the other word lines WL1A to WL3A. As a result, current is supplied from the selected word line WL0A to global bit line GBL0, thereby increasing the potential of global bit line GBL0. In this manner, data (a low-resistance state or a high-resistance state) can be read from the first resistance-change memory element R1 selected by word line WL0A.

The leakage current from the non-selected first resistance-change memory elements R1 connected to the non-selected word lines WL1A to WL3A can prevent deterioration of signals if the voltage between word lines WL1A to WL3A and global bit line GBL0 is less than or equal to the signal amount.

FIG. 4 is a timing chart showing a method of suppressing disturbance of a non-selected cell.

When voltage is applied between a select switch control signal line and a global bit line, the potential of a local bit line changes depending on whether the second resistance-change memory element R2 is in a low-resistance state or in a high-resistance state. This change causes disturbance of a non-selected cell.

In the method shown in FIG. 4, a non-selected cell is partially set to a low-resistance state in advance. If the voltage of a non-selected word line is set to VAB, the change in potential of a local bit line can be prevented by the current which flows in the cell connected to the non-selected word line. In this manner, disturbance can be suppressed.

In the method shown in FIG. 4, voltages having opposite directions are applied to two word lines. In a phase-change memory element using a chalcogenide material including GeSbTe or a phase-change memory element using a superlattice material including GeTe and SbTe, a unipolar operation is performed. Thus, the resistance state of a resistance-change memory element can be set by supplying current in either direction. Therefore, the resistance state of a resistance-change memory element may be set by applying voltage to two word lines in opposite directions as shown in FIG. 4.

As explained above, in the present embodiment, the second resistance-change memory element R2 is used as a select element (select switch). Thus, there is no need to use a transistor as a select switch. In this manner, it is possible to prevent a large increase in the cell size or the number of manufacturing processes. In particular, when a three-dimensional structure is employed as described later, the second resistance-change memory element R2 can be formed by the same process and be formed so as to have the same dimensions as the first resistance-change memory element R1. Thus, it is possible to prevent a large increase in the cell size or the number of manufacturing processes.

Embodiment 2

FIG. 5 is an electronic schematic showing a structure of a semiconductor memory device (semiconductor integrated circuit device) according to a second embodiment. Since the basic matters are the same as those of the first embodiment, the explanations of matters that are described in the first embodiment are omitted.

In the present embodiment, instead of the diode DI of FIG. 1, a third resistance-change memory element R3 is used as a select control element. The size of the third resistance-change memory element R3 is preferably larger than that of the first resistance-change memory element R1 and smaller than that of the second resistance-change memory element R2.

The basic operation of the present embodiment is the same as that of the first embodiment. In the present embodiment, when voltage is applied between select switch control signal line SSCA and global bit line GBL0, voltage is applied to both the second resistance-change memory element R2 and the third resistance-change memory element R3. When the voltage pulse is set so as to fall rapidly in a manner similar to FIG. 2A, the second and third resistance-change memory elements R2 and R3 are set to a high-resistance state. When the voltage pulse is set so as to fall gradually in a manner similar to FIG. 2B, the second and third resistance-change memory elements R2 and R3 are set to a low-resistance state. In this way, the state of the second and third resistance-change memory elements R2 and R3 can be set (to an on-state/off-state). The write operation and the read operation relative to the first resistance-change memory elements R1 are the same as those of FIG. 3A and FIG. 3B. The leakage current may be suppressed by setting the control signal of the third resistance-change memory element R3 so as to be the same as the voltage of the non-selected word lines.

FIG. 6A and FIG. 6B show a structure and an operation of a modification example of the present embodiment. In the modification example, as shown in FIG. 6A, two third resistance-change memory elements R3 are provided for select switch control. In this case, as shown in FIG. 6B, both of the two third resistance-change memory elements R3 are set to a low-resistance state by applying a reverse bias. This allows higher voltage to be applied to the second resistance-change memory element R2 for a select switch.

As described above, the basic structure and the basic operation of the present embodiment are the same as those of the first embodiment. An effect similar to that of the first embodiment can be obtained from the present embodiment. In the present embodiment, instead of a diode, the third resistance-change memory element R3 is used. Therefore, the third resistance-change memory element R3 can be formed by the same manufacturing process as the first resistance-change memory element R1 and the second resistance-change memory element R2. Thus, the manufacturing process can be further simplified compared to the first embodiment.

In the first and second embodiments, as a resistance-change memory element, a bipolar element which controls the resistance state (a low-resistance state and a high-resistance state) by applying voltage in a plus direction and a minus direction may be employed.

FIG. 7A and FIG. 7B show a structure and an operation when a bipolar element is used. For example, instead of the diode DI shown in FIG. 1, a bidirectional diode DIB is used as shown in FIG. 7A. When the resistance state of the resistance-change memory element used as a select switch is controlled, as shown in FIG. 7B and FIG. 7C, voltage is applied in opposite directions between select switch control signal line SSCA and global bit line GBL. In this manner, the resistance-change memory element can be set to a low-resistance state or a high-resistance state.

Embodiment 3

Next, this specification explains a third embodiment. In the present embodiment, the semiconductor memory device shown in the first embodiment is applied to a semiconductor memory device having a three-dimensional structure.

FIG. 8A is a plan view showing a structure of a semiconductor memory device according to the third embodiment. FIG. 8B, FIG. 8C and FIG. 8D are cross-sectional views taken along line B-B, line C-C and line D-D of FIG. BA, respectively. Normally, an insulating material (insulating film; not shown) is provided in spaces between structural elements (interconnections, resistance-change memory elements, diodes, etc.). This structure is also applied to FIG. 9A to FIG. 9D, FIG. 10A to FIG. 10D, FIG. 16A to FIG. 16D and FIG. 17A to FIG. 17D.

In the present embodiment, a plurality of first resistance-change memory elements R1, a second resistance-change memory element R2 and a diode (rectifier element) DI are stacked vertically on a semiconductor substrate.

As shown in the figures, the diode DI is formed on a select switch control signal line SSC, and a local bit line LBL is formed on the diode DI. The local bit line LBL extends vertically. A plurality of word lines WL are stacked vertically. Each word line WL extends horizontally. As the top layer of the word lines, word line fWL for a flag or word line aWL for an anchor is formed.

The first resistance-change memory element R1 is formed between the local bit line LBL and word line WL. Specifically, the first resistance-change memory element R1 is formed on both sides of the local bit line LBL. A forth resistance-change memory element R4 for a flag or an anchor is formed between word line fWL for a flag (or word line aWL for an anchor) and the local bit line LBL.

The second resistance-change memory element R2 functioning as a select switch is stacked above the plurality of first resistance-change memory elements R1. The second resistance-change memory element R2 is also formed on both sides of the local bit line LBL. As shown in the figures, the size of the second resistance-change memory element R2 is larger than that of each of the first resistance-change memory elements R1. With this structure, the resistance of the second resistance-change memory element R2 can be low. Above the second resistance-change memory element R2, a global bit line GBL is formed.

To manufacture the above-described semiconductor memory device, the lamination structure of word lines WL is formed. Subsequently, the first resistance-change memory element R1 is formed on a side wall of each word line WL. After that, the local bit line LBL is buried to be formed.

The structure and the manufacturing method described above enable the pattern of each layer to be formed in a lump without applying a lithographic process to each layer. Thus, the number of manufacturing processes can be largely decreased. In particular, the second resistance-change memory element R2 can be formed by the same process as the first resistance-change memory element R1. Thus, the number of manufacturing processes can be considerably reduced.

In addition, as the diode DI is formed in the lower part of the lamination, the diode DI can be formed at a high temperature, thereby making the diode DI excellent in on/off characteristics.

As shown in the figures, the occupation area of the diode DI can be reduced by structuring the diode DI so as to be concaved.

FIG. 9A is a plan view showing a structure of the semiconductor memory device according to a first modification example of the present embodiment. FIG. 9B, FIG. 9C and FIG. 9D are cross-sectional views taken along line B-B, line C-C and line D-D of FIG. 9A, respectively.

In the present embodiment, the diode DI and the select switch control signal line SSC are formed in the upper part of the lamination. The second resistance-change memory element R2 and the global bit line GBL are formed in the lower part of the lamination. The other basic matters are the same as those of the aforementioned embodiment.

In this modification example, in a manner similar to the above embodiment, the pattern of each layer can be formed in a lump. Therefore, the number of manufacturing processes can be largely decreased.

Figures 10A, 10B, 10C, 10D:
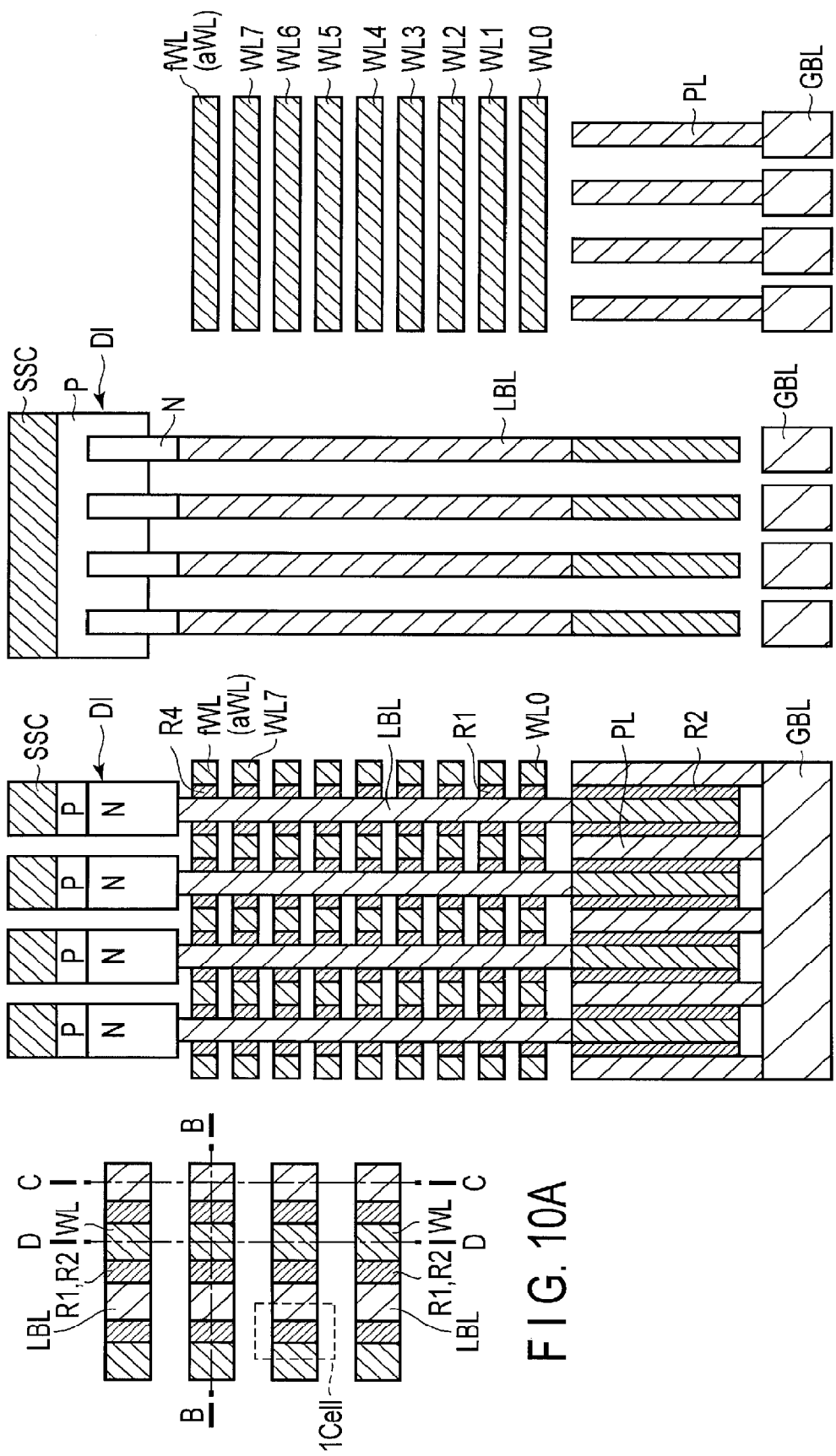
FIG. 10A is a plan view showing a structure of the semiconductor memory device according to a second modification example of the third embodiment.
FIG. 10B is a cross-sectional view taken along line B-B of FIG. 10A.
FIG. 10C is a cross-sectional view taken along line C-C of FIG. 10A.
FIG. 10D is a cross-sectional view taken along line D-D of FIG. 10A.

FIG. 10A is a plan view showing a structure of the semiconductor memory device according to a second modification example of the present embodiment. FIG. 10B, FIG. 10C and FIG. 10D are cross-sectional views taken along line B-B, line C-C and line D-D of FIG. 10A, respectively.

In this modification example, in a manner similar to the first modification example, the diode DI and the select switch control signal line SSC are formed in the upper part of the lamination, and the second resistance-change memory element R2 and the global bit line GBL are formed in the lower part of the lamination.

In this modification example, apart from the local bit line LBL, a plug PL is provided. The plug PL is connected to the global bit line GBL. In this modification example, even if the writing and reading characteristic in a positive direction is asymmetric relative to the writing and reading characteristic in a negative direction, problems can be avoided by using only one polar character.

FIG. 11 shows a equivalent circuit of a sub-memory cell block in the three-dimensional semiconductor memory device shown in FIG. 8A to FIG. 8D, FIG. 9A to FIG. 9D and FIG. 10A to FIG. 10D.

As stated above, the fourth resistance-change memory element R4 for a flag (or an anchor) is provided between word line fWL for a flag (or word line aWL for an anchor) and the local bit line LBL.

The fourth resistance-change memory element R4 for a flag is provided such that the number of first resistance-change memory elements R1 in an on-state (low-resistance state) in the sub-memory cell block is greater than or equal to a predetermined number. The fourth resistance-change memory element R4 for a flag functions as a flag for inverting the data of the first resistance-change memory elements R1 included in the sub-memory cell block. When the number of the first resistance-change memory elements R1 in an on-state (low-resistance state) in the sub-memory cell block is greater than or equal to a predetermined number, the change in potential of the local bit line can be prevented by the current which flows in the first resistance-change memory elements R1 in an on-state. Thus, disturbance can be suppressed. The fourth resistance-change memory element R4 for an anchor may be provided and set so as to be always in an on-state (low-resistance state).

Figure 12:
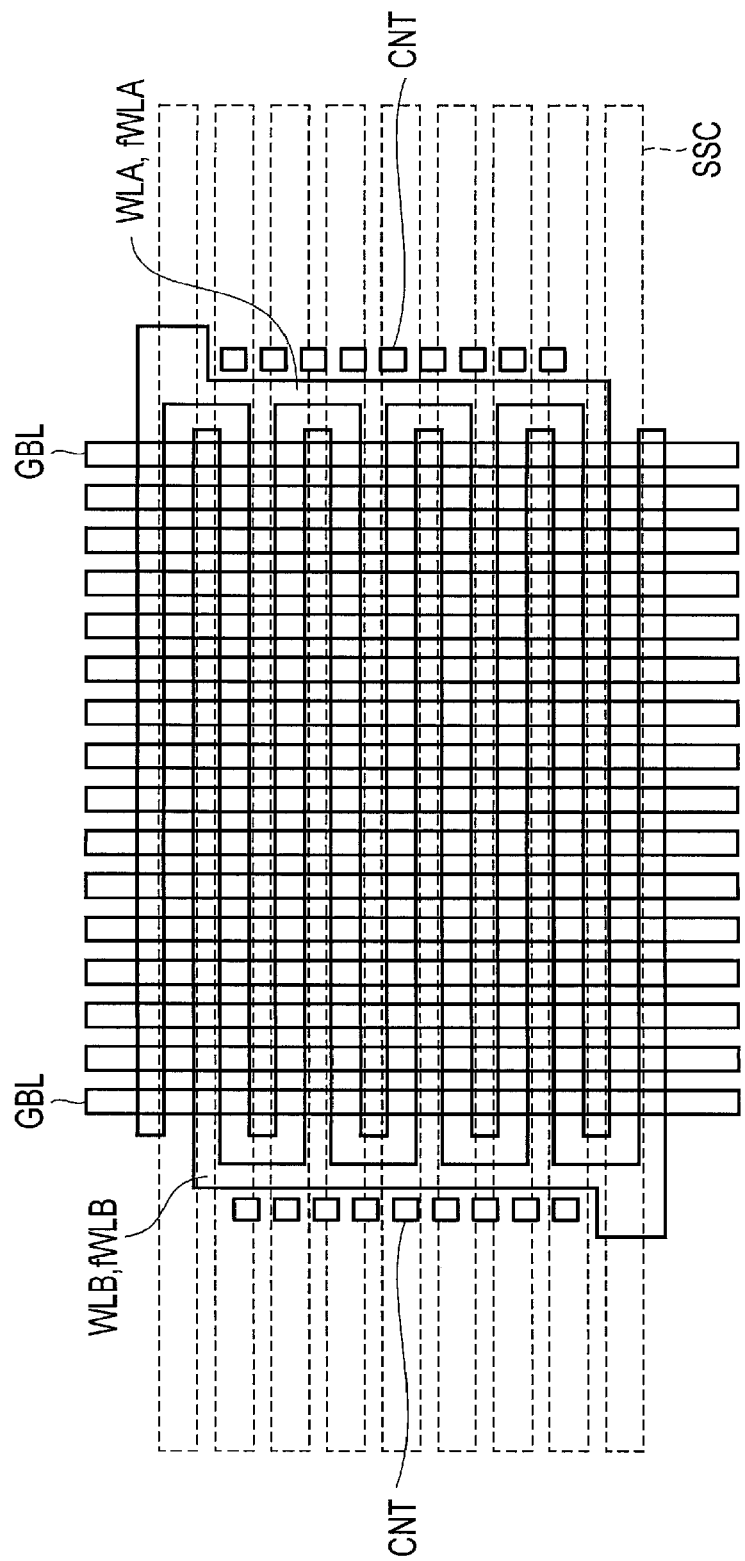
FIG. 12 is a plan pattern diagram showing the structure of the semiconductor memory device according to the third embodiment.

FIG. 12 is a plan pattern diagram showing the structure of the three-dimensional semiconductor memory device shown in FIG. 8A to FIG. 8D, FIG. 9A to FIG. 9D and FIG. 10A to FIG. 10D.

FIG. 12 shows only one layer of word lines (WLA, WLB, fWLA, fWLB); however, in the actual device, a plurality of layers of word lines are present in the depth direction of the paper. The plurality of layers of word lines are formed by a process using the same mask in a lump. The word lines are communalized in every other line. Contacts CNT are connected to the word lines.

The select switch control signal line SSC extends laterally and can be shared by one array in which a plurality of sub-memory cell blocks are integrated. The global bit line GBL extends longitudinally.

FIG. 13 shows the analysis result of the potential of the local bit line LBL when voltage is applied between the diode DI and the second resistance-change memory element R2. As shown in FIG. 13, when 2 V is applied, approximately 1 V is applied to the diode DI, and approximately 1 V is applied to the second resistance-change memory element R2. Thus, the second resistance-change memory element R2 can function as a select switch.

Figure 14A:
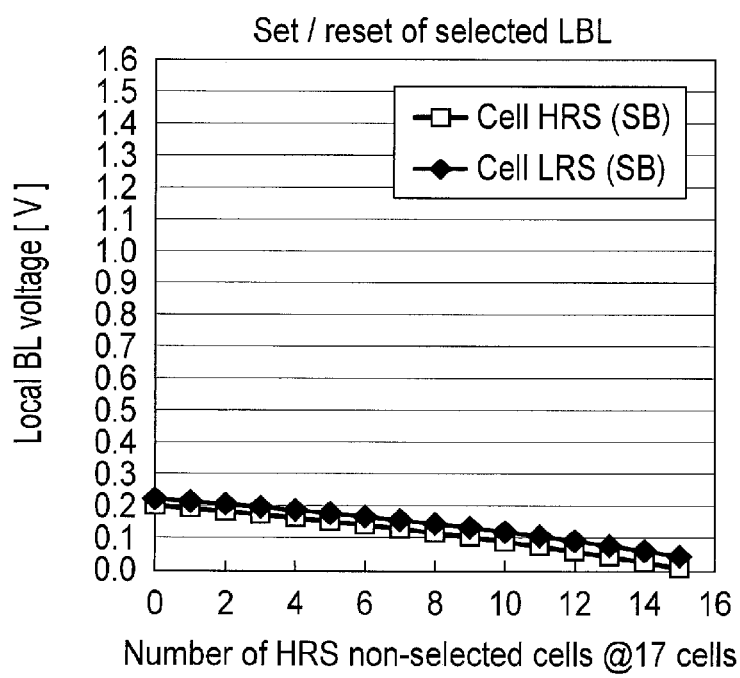
FIG. 14A shows the relationship between the number of HRS non-selected cells and the local bit line voltage according to the third embodiment.
Figure 14B:
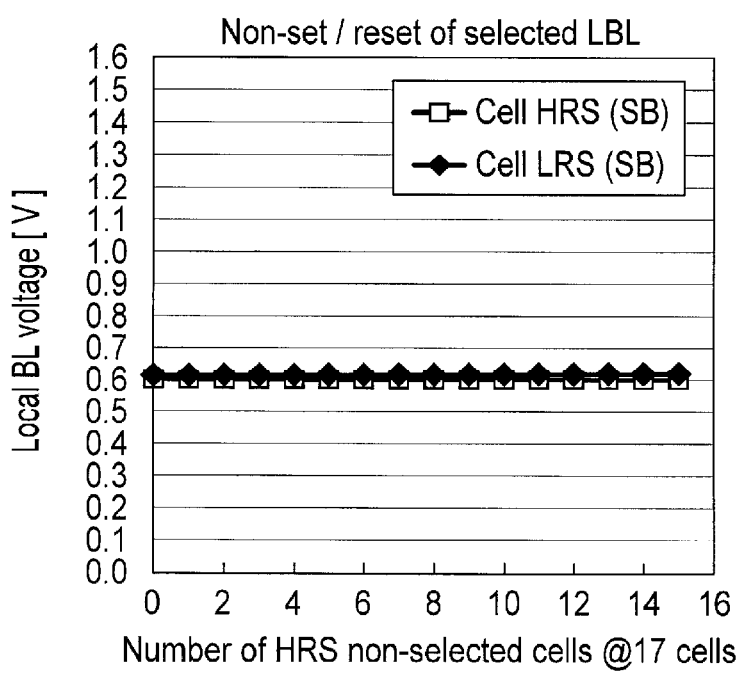
FIG. 14B shows the relationship between the number of HRS non-selected cells and the local bit line voltage according to the third embodiment.
Figure 14C:
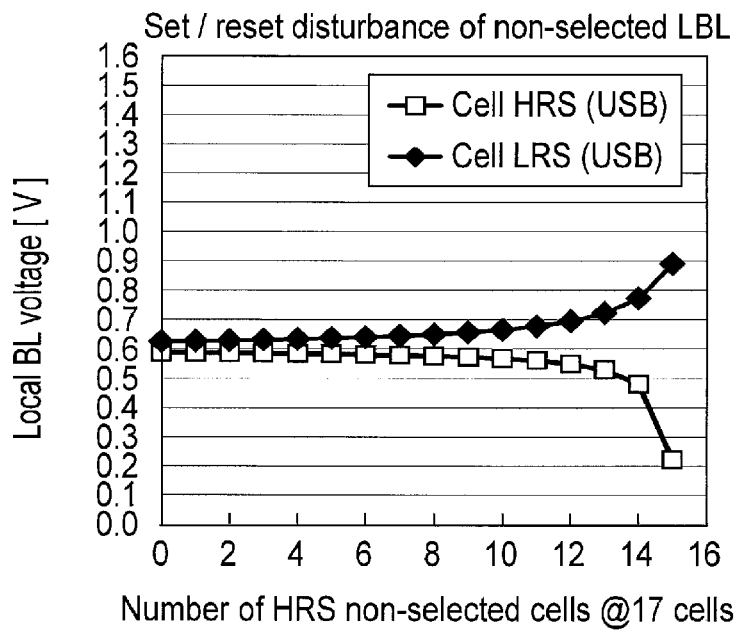
FIG. 14C shows the relationship between the number of HRS non-selected cells and the local bit line voltage according to the third embodiment.

FIG. 14A shows the relationship between the number of HRS non-selected cells and the local bit line voltage with respect to set/reset of a selected local bit line LBL. FIG. 14B shows the relationship between the number of HRS non-selected cells and the local bit line voltage with respect to non-set/reset of a selected local bit line LBL. FIG. 14C shows the relationship between the number of HRS non-selected cells and the local bit line voltage with respect to set/reset disturbance of a non-selected local bit line LBL.

Figure 14D:
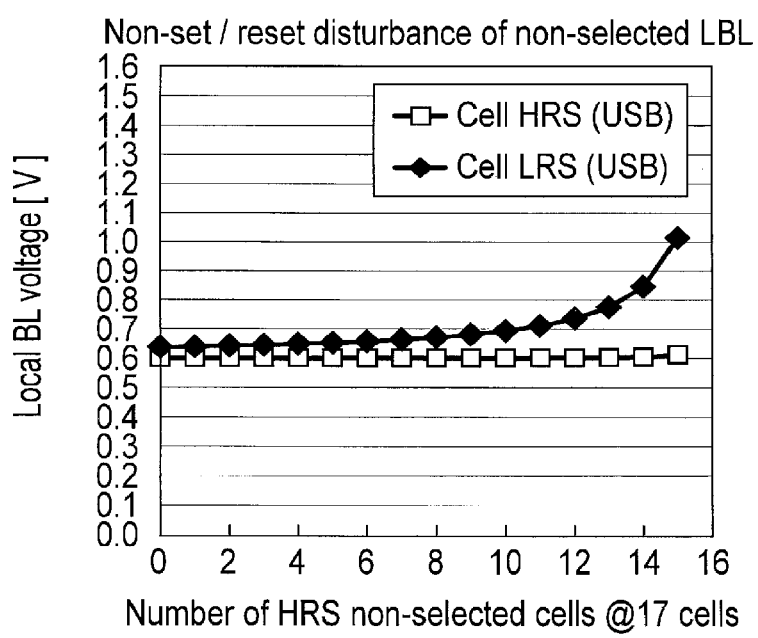
FIG. 14D shows the relationship between the number of HRS non-selected cells and the local bit line voltage according to the third embodiment.

FIG. 14D shows the relationship between the number of HRS non-selected cells and the local bit line voltage with respect to non-set/reset disturbance of a non-selected local bit line LBL. In all of these cases, the voltage of the global bit line GBL is zero; the voltage of the selected word line WL is 1.2 V; the voltage of the non-selected word line WL is 0.6 V; and the voltage of the select switch control signal line SSC is 0.6 V.

When the voltage applied to selected cells is 1 V, the maximum voltage applied to non-selected cells is suppressed at approximately 0.6 V. If the number of non-selected cells in the lateral axis is increased, the potential of the local bit line is changed, thereby easily causing disturbance. Therefore, the number of cells in a selected (low-resistance) state is preferably increased by introducing cells for flags or anchors.

FIG. 15A, FIG. 15B and FIG. 15C show effects which are obtained when a cell for a flag is introduced. A single flag cell is provided for a group of four memory cells. If two or more memory cells are in an off-state (high-resistance state), the flag is set to invert the cell state. Thus, it is possible to increase the number of cells in an on-state (low-resistance state) by providing a flag cell. A similar effect can be obtained when an anchor cell is provided and is set so as to be always in an on-state.

Embodiment 4

Now, this specification explains a fourth embodiment. In this embodiment, the semiconductor memory device shown in the second embodiment is applied to a semiconductor memory device having a three-dimensional structure. The basic matters are the same as those of the third embodiment. Thus, the explanations of matters that are described in the third embodiment are omitted.

FIG. 16A is a plan view showing a structure of a semiconductor memory device according to the forth embodiment. FIG. 16B, FIG. 16C and FIG. 16D are cross-sectional views taken along line B-B, line C-C and line D-D of FIG. 16A, respectively.

In the present embodiment, a second resistance-change memory element R2, a third resistance-change memory element R3 and a plurality of first resistance-change memory elements R1 are stacked vertically on a semiconductor substrate.

As shown in the figures, the second resistance-change memory element R2 for a select switch is formed on a global bit line GBL. The third resistance-change memory element R3 for select switch control is formed on the second resistance-change memory element R2. The first resistance-change memory elements R1 which function as memory cells are formed on the third resistance-change memory element R3. The other basic structures are the same as those of the third embodiment.

In the present embodiment, the first resistance-change memory elements R1, the second resistance-change memory element R2 and the third resistance-change memory element R3 can be formed by a process in a lump. Thus, the manufacturing process can be further simplified compared to a case where a diode for select switch control is employed.

FIG. 17A is a plan view showing a structure of the semiconductor memory device according to a modification example of the present embodiment. FIG. 17B, FIG. 17C and FIG. 17D are cross-sectional views taken along line B-B, line C-C and line D-D of FIG. 17A, respectively.

In this modification example, the plurality of resistance-change memory elements R1, the third resistance-change memory element R3 and the second resistance-change memory element R2 are stacked vertically on the semiconductor substrate. In other words, the stacking order of the resistance-change memory elements R1, R2 and R3 is opposite to that of the above embodiment.

In this modification example, the pattern of each layer can be formed in a lump. Thus, the manufacturing process can be simplified.

Figure 18:
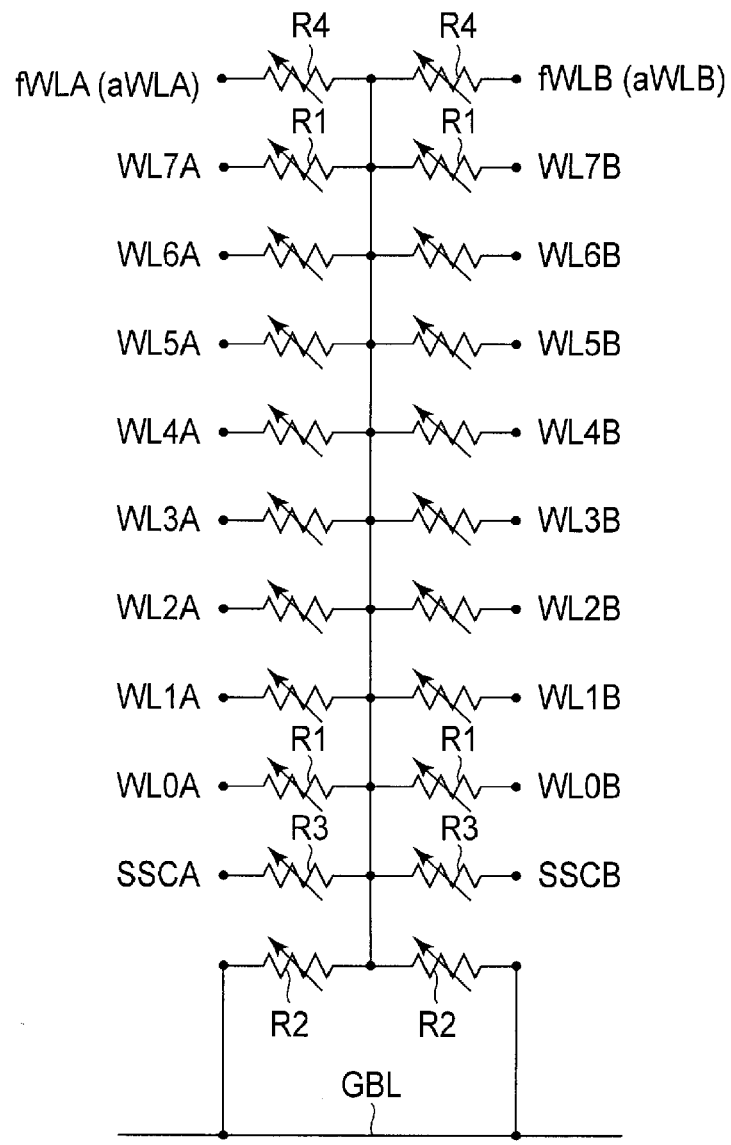
FIG. 18 shows an equivalent circuit of a sub-memory cell block in the semiconductor memory device according to the fourth embodiment.

FIG. 18 shows an equivalent circuit of a sub-memory cell block in the three-dimensional semiconductor memory device shown in FIG. 16A to FIG. 16D and FIG. 17A to FIG. 17D. The basic matters are the same as those of FIG. 11 of the third embodiment. Thus, the detailed explanations are omitted.

Figure 19:
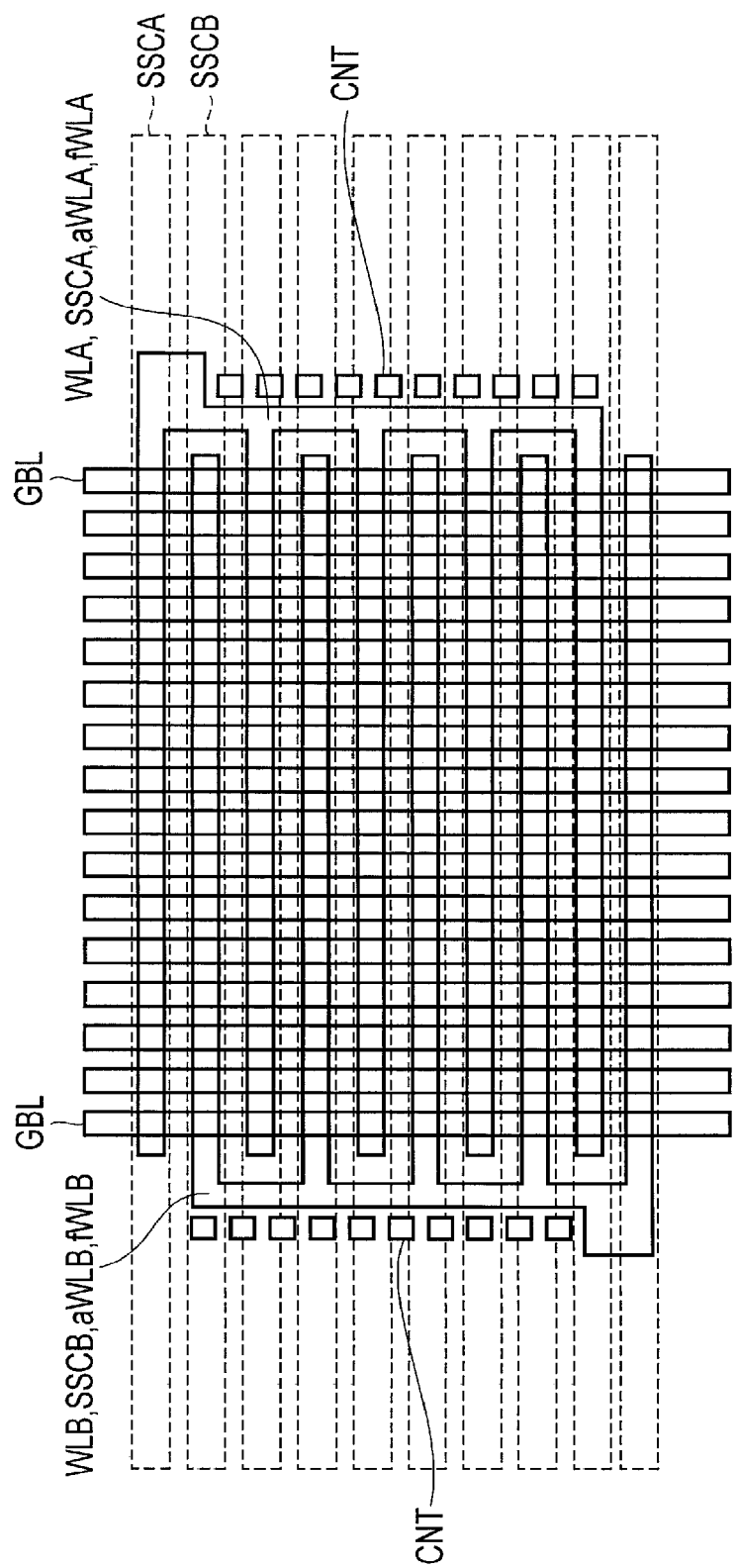
FIG. 19 is a plan pattern diagram showing the structure of the semiconductor memory device according to the fourth embodiment.

FIG. 19 is a plan pattern view showing the structure of the three-dimensional semiconductor memory device shown in FIG. 16A to FIG. 16D and FIG. 17A to FIG. 17D. The basic matters are the same as those of FIG. 12 of the third embodiment. Thus, the explanations of matters that are described in the third embodiment are omitted.

In the structure shown in FIG. 19, select switch control signal lines SSCA and SSCB are provided in the same positions as word lines WLA and WLB. In sub-memory cell arrays in which select switch control signal lines SSCA and SSCB are simultaneously operated, it is possible to select only a sub-memory cell array positioned at an intersection with the selected global bit line GBL. In this manner, IR drop or RC delay can be prevented.

FIG. 20 shows the local bit line voltage when the structure of the present embodiment is used. The voltage of the global bit line GBL is zero; the voltage of the select switch control signal line SSC is 2.3 V; and the voltage of the non-selected word line WL is 1.6 V. When the number of memory cells in a high-resistance state is halved by using a word line for a flag, 1 V can be applied to the select switch side. In this manner, the select switch can be turned on/off.

Figure 21A:
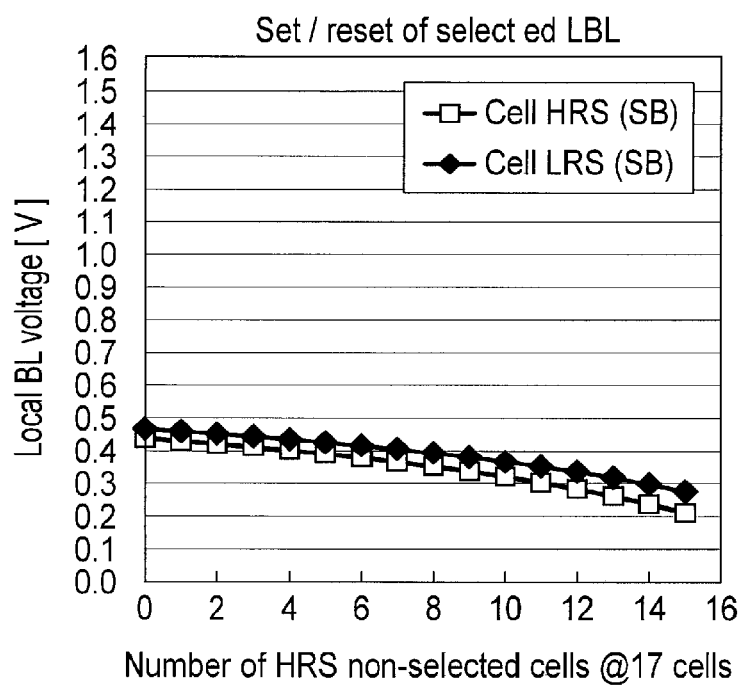
FIG. 21A shows the relationship between the number of HRS non-selected cells and the local bit line voltage according to the fourth embodiment.
Figure 21B:
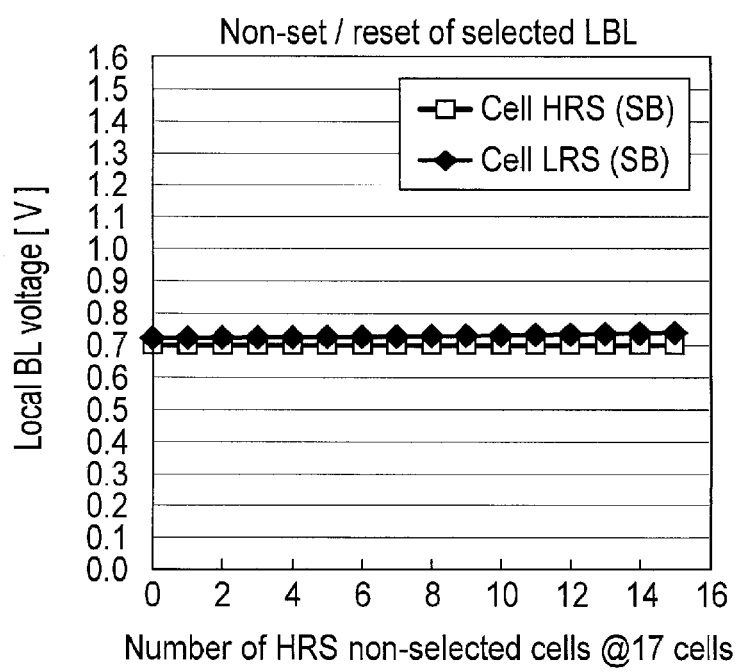
FIG. 21B shows the relationship between the number of HRS non-selected cells and the local bit line voltage according to the fourth embodiment.

FIG. 21A shows the relationship between the number of HRS non-selected cells and the local bit line voltage with respect to set/reset of a selected local bit line LBL. FIG. 21B shows the relationship between the number of HRS non-selected cells and the local bit line voltage with respect to non-set/reset of a selected local bit line LBL. FIG. 21C shows the relationship between the number of HRS non-selected cells and the local bit line voltage with respect to set/reset disturbance of a non-selected local bit line LBL. FIG. 21D shows the relationship between the number of HRS non-selected cells and the local bit line voltage with respect to non-set/reset disturbance of a non-selected local bit line LBL. In all of these cases, the voltage of the global bit line GBL is zero; the voltage of the selected word line WL is 1.4 V; the voltage of the non-selected word line WL is 0.7 V; and the voltage of the select switch control signal line SSC is 0.7 V.

When the voltage applied to selected cells is 1 V, the maximum voltage applied to non-selected cells is approximately 0.7 V. Thus, it is possible to sufficiently operate a phase-change memory which is excellent in disturbance resistance.

In the first to fourth embodiments, the first to fourth resistance-change memory elements may be formed of a chalcogenide material including GeSbTe, a superlattice material of GeTe and SbTe, a binary or ternary transition metal oxide material, an oxide material containing Au or Cu or a chalcogenide material containing Au or Cu. The resistance-change memory elements formed of these materials can be applied to a semiconductor memory device such as a phase-change memory (PRAM, PCM) and a resistance-change memory (RRAM, ReRAM). Data can be written or read relative to the resistance-change memory elements by controlling, for example, the application voltage, the supply current, the pulse period of signals and the rise and fall times of signals depending on the used materials.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of first resistance-change memory elements of a two-terminal type;
   a second resistance-change memory element of a two-terminal type;
   a third resistance-change memory element of a two-terminal type;
   a local bit line connected to one end of each of the first resistance-change memory elements, one end of the second resistance-change memory element and one end of the third resistance-change memory element; and
   a global bit line connected to the other end of the second resistance-change memory element.

2. The device of claim 1, wherein
   the second resistance-change memory element is set to a high-resistance state by supplying a high-resistance-state setting signal between the other end of the third resistance-change memory element and the global bit line, and the second resistance-change memory element is set to a low-resistance state having a resistance lower than that in the high-resistance state by supplying a low-resistance-state setting signal between the other end of the third resistance-change memory element and the global bit line, and
   data is written and read for a desired one of the first resistance-change memory elements connected to the second resistance-change memory element set to the low-resistance state.

3. The device of claim 2, wherein
   the first resistance-change memory elements, the second resistance-change memory element and the third resistance-change memory element are stacked vertically.

4. The device of claim 3, wherein
   the first resistance-change memory elements, the second resistance-change memory element and the third resistance-change memory element are selected from a chalcogenide material including GeSbTe, a superlattice material of GeTe and SbTe, a binary or ternary transition metal oxide material, an oxide material containing Au or Cu, and a chalcogenide material containing Au or Cu.

5. The device of claim 2, wherein
   the first resistance-change memory elements, the second resistance-change memory element and the third resistance-change memory element are selected from a chalcogenide material including GeSbTe, a superlattice material of GeTe and SbTe, a binary or ternary transition metal oxide material, an oxide material containing Au or Cu, and a chalcogenide material containing Au or Cu.

6. The device of claim 1, wherein
the first resistance-change memory elements, the second resistance-change memory element and the third resistance-change memory element are stacked vertically.

7. The device of claim 6, wherein
the first resistance-change memory elements, the second resistance-change memory element and the third resistance-change memory element are selected from a chalcogenide material including GeSbTe, a superlattice material of GeTe and SbTe, a binary or ternary transition metal oxide material, an oxide material containing Au or Cu, and a chalcogenide material containing Au or Cu.

8. The device of claim 1, wherein
the first resistance-change memory elements, the second resistance-change memory element and the third resistance-change memory element are selected from a chalcogenide material including GeSbTe, a superlattice material of GeTe and SbTe, a binary or ternary transition metal oxide material, an oxide material containing Au or Cu, and a chalcogenide material containing Au or Cu.

9. The device of claim 1, wherein
the second resistance-change memory element is connected between the local bit line and the global bit line.

10. The device of claim 1, wherein
each of the first resistance-change memory elements is connected between the local bit line and a word line.

11. The device of claim 1, wherein
the third resistance-change memory element is connected between the local bit line and a select switch control signal line to which a voltage for selecting the plurality of first resistance-change memory elements is applied.

12. The device of claim 1, wherein
the global bit line is connected to a sense-amplifier and a writing driver.

13. The device of claim 1, wherein
the second resistance-change memory element is connected between the local bit line and the global bit line,
each of the first resistance-change memory elements is connected between the local bit line and a word line,
the third resistance-change memory element is connected between the local bit line and a select switch control signal line to which a voltage for selecting the plurality of first resistance-change memory elements is applied, and
the global bit line is connected to a sense-amplifier and a writing driver.

* * * * *